United States Patent
Coignus et al.

(10) Patent No.: US 10,067,185 B2
(45) Date of Patent: Sep. 4, 2018

(54) SYSTEM FOR THE CHARACTERISATION OF A FLASH MEMORY CELL

(71) Applicant: COMMISSARIAT A L'ENERGIE ATOMIQUE ET AUX ENERGIES ALTERNATIVES, Paris (FR)

(72) Inventors: Jean Coignus, Grenoble (FR); Alexandre Vernhet, Saint Martin D'Heres (FR)

(73) Assignee: COMMISARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 275 days.

(21) Appl. No.: 14/996,520

(22) Filed: Jan. 15, 2016

(65) Prior Publication Data

US 2016/0209466 A1  Jul. 21, 2016

(30) Foreign Application Priority Data

Jan. 15, 2015  (FR) ...................... 15 50306

(51) Int. Cl.
  *G01R 31/02* (2006.01)
  *G01R 31/3177* (2006.01)
  (Continued)

(52) U.S. Cl.
  CPC ..... *G01R 31/3177* (2013.01); *G01R 31/2621* (2013.01); *G01R 31/2648* (2013.01);
  (Continued)

(58) Field of Classification Search
  CPC ............ G01R 31/3177; G01R 31/2648; G01R 31/2621; G11C 29/06; G11C 29/50004; G11C 29/12015
  See application file for complete search history.

(56) References Cited

U.S. PATENT DOCUMENTS 5,289,401 A * 2/1994 Shima .................... G06N 3/063
  365/185.24
5,966,330 A * 10/1999 Tang ...................... G11C 16/26
  365/185.09
(Continued)

OTHER PUBLICATIONS

Search Report as issued in French Patent Application No. 1550306, dated May 13, 2015.
(Continued)

*Primary Examiner* — Tung X Nguyen
*Assistant Examiner* — Dominic Hawkins
(74) *Attorney, Agent, or Firm* — Pillsbury Winthrop Shaw Pittman LLP

(57) ABSTRACT

A system for characterising a NOR flash memory cell provided with a floating gate transistor, includes a voltage generator having an output connected to the gate electrode that generates as output an erase signal; and a dynamic measurement apparatus including a first channel connected to the gate electrode and a second channel connected to the drain electrode. The dynamic measurement apparatus generates on the first and second channels write signals and measures a current flowing in the drain electrode during the writing of the memory cell. Only the gate electrode of the floating gate transistor is connected to the voltage generator and to the dynamic measurement apparatus by a CMOS switch, which switches between a first position, where the output of the voltage generator is electrically coupled to the gate electrode, and a second position, where the first channel of the measurement device is electrically coupled to the gate electrode.

4 Claims, 5 Drawing Sheets

(51) Int. Cl.
*G11C 29/06* (2006.01)
*G11C 29/12* (2006.01)
*G11C 29/50* (2006.01)
*G01R 31/26* (2014.01)

(52) U.S. Cl.
CPC ........ *G11C 29/06* (2013.01); *G11C 29/12015* (2013.01); *G11C 29/50004* (2013.01)

(56) References Cited

U.S. PATENT DOCUMENTS

| | | | |
|---|---|---|---|
| 6,275,415 B1 * | 8/2001 | Haddad | G11C 16/12 |
| | | | 365/185.11 |
| 6,510,085 B1 | 1/2003 | Fastow et al. | |
| 6,687,155 B2 * | 2/2004 | Nagasue | G11C 27/005 |
| | | | 365/185.03 |
| 7,489,560 B2 * | 2/2009 | Chang | G11C 5/146 |
| | | | 365/185.18 |
| 9,142,322 B2 * | 9/2015 | Baranwal | G11C 29/08 |
| 9,502,137 B2 * | 11/2016 | Yoon | G06F 11/1068 |
| 2006/0133147 A1 * | 6/2006 | Lee | G11C 16/30 |
| | | | 365/185.18 |
| 2007/0047353 A1 | 3/2007 | Choi et al. | |
| 2007/0296487 A1 * | 12/2007 | Kuriyama | G05F 3/262 |
| | | | 327/543 |
| 2008/0279006 A1 | 11/2008 | Nagatani et al. | |
| 2008/0291723 A1 * | 11/2008 | Wang | G11C 16/3404 |
| | | | 365/185.3 |
| 2009/0103360 A1 * | 4/2009 | Kang | G11C 11/5628 |
| | | | 365/185.03 |
| 2012/0124273 A1 * | 5/2012 | Goss | G11C 16/349 |
| | | | 711/103 |
| 2012/0170377 A1 | 7/2012 | Akaogi | |
| 2013/0061101 A1 * | 3/2013 | Fitzpatrick | G11C 16/349 |
| | | | 714/718 |

OTHER PUBLICATIONS

Della Marca, V., et al., "Impact of endurance degradation on the programming efficiency and the energy consumption of NOR flash memories," Microelectronics Reliability, 2014, vol. 54, pp. 2262-2265.

* cited by examiner

SYSTEM FOR THE CHARACTERISATION OF A FLASH MEMORY CELL

CROSS-REFERENCE TO RELATED APPLICATIONS

This application claims priority to French Patent Application No. 1550306, filed Jan. 15, 2015, the entire content of which is incorporated herein by reference in its entirety.

FIELD

This invention relates to the field of characterising floating-gate non-volatile memories, also called charge trap memories, and more particularly to the endurance tests carried out on NOR-type flash memories in order to evaluate their reliability.

BACKGROUND

A flash memory is conventionally formed from a plurality of memory cells that can be electrically programed individually, with a large number of cells, called a block, sector or page, able to be erased simultaneously and electrically.

Each flash memory cell is provided with a NMOS transistor comprising a substrate or bulk, source and drain regions formed in the substrate, and a control gate. A conduction channel can be formed in the substrate, between the source and drain regions, according to the bias of the gate of the transistor. This transistor further comprises a site for storing electrical charges, called a floating gate, formed for example of a polysilicon layer arranged between two layers of oxide, and located between the control gate and the conduction channel.

The control gate and the drain of the floating gate transistor are biased differently according to whether it is desired to write, erase or read the memory cell. FIG. 1 is a simplified representation of the signals applied on the control gate and on the drain during the write, erase and read operations of a NOR-type flash memory cell. The bulk and the source are connected to the ground for each one of these operations.

The memory cell can be written to, or programed, by applying simultaneously for 1 μs to 10 μs a high voltage on the control gate, for example between 7 V and 10 V, and a more moderate voltage on the drain of the floating gate transistor, for example between 3 V and 5 V. These voltages allow for the passage of very high energy electrons (referred to as "hot electrons") from the conduction channel to the floating gate. The electrons are then trapped in the floating gate and cause an increase in the threshold voltage of the transistor. The memory cell thus passes from a "low" or "erased" state, characterised by a low voltage threshold (2 V-4 V), to a "high" or "written" state, characterised by a high voltage threshold (6 V-9 V). In a flash memory cell, one bit of information is therefore encoded by the level of the threshold voltage of the transistor, typically '0' for the low threshold voltage (erased state) and '1' for the high threshold voltage (written state).

The erasing of the memory cell is performed by applying for 1 ms to 200 ms a high negative voltage on the control gate, for example between −10 V and −20 V, while the drain is connected to the ground (zero voltage). This makes it possible to evacuate the electrons trapped in the floating gate, via the tunnel effect through the gate oxide. Thus, the threshold voltage of the transistor is lowered and the memory cell returns to its erased state.

A method for reading the memory cell (i.e. in order to determine its state: written or erased) consists in applying a voltage ramp on the control gate, for example from 0 V to 10 V, while the drain is biased at a voltage of about 0.5 V, and in measuring the drain current during this voltage ramp. Thus, a drain current/gate voltage characteristic is obtained that makes it possible to determine the threshold voltage of the transistor.

In order to evaluate the reliability of the flash memory cell during its technological development, a technique called "endurance measurement" consists in subjecting the memory cell to a multitude of write and erase cycles in a very short lapse of time (in order to accelerate its ageing) and in following the changes in the voltage thresholds of the written state and of erased state over time.

FIG. 2 is an example of curves coming from the endurance measurement of a NOR-type flash memory cell (1T-NOR). These curves show the threshold voltage $V_T$ of the transistor in the written state (upper curve) and the threshold voltage $V_T$ of the transistor in the erased state (lower curve), according to the number of write/erase cycles that the memory cell was subjected to. A decrease in the threshold voltage $V_T$ of the written state and an increase in the threshold voltage $V_T$ of the erased state are observed, as the number of write/erase cycles increases. In other words, the programming window, which corresponds to the difference between the two levels of the threshold voltage $V_T$, is reduced as time passes. When this difference decreases below a certain value, for example 3 V, it becomes difficult to distinguish the written state from the erased state and the information stored in the memory cell is lost. This progressive closing of the programming window is linked to an ageing of the gate oxide located between the floating gate and the conduction channel (trapping of electrical charges in the oxide, appearance of defects, etc.).

Each point on the curves of FIG. 2 was obtained by performing a read on the memory cell, after the latter had been written to (for the upper curve) or erased (for the lower curve). The conventional endurance measurement for a flash memory cell therefore consists in applying alternating write and erase signals of the memory cell, and to read from time to time the memory cell in the erased state and in the written state, in order to determine their respective threshold voltage.

FIG. 3 schematically shows a characterisation system that is commonly used to perform this endurance measurement. The memory cell is symbolised by a floating gate transistor 30 provided with four electrodes: the gate G, the drain D, the source S and the bulk B.

The characterisation system comprises a voltage generator 31 able to supply voltages between +20 V and −20 V for a minimum duration of about on microsecond. This generator 31 has a first channel ch1 connected to the gate electrode G of the transistor 30 by the intermediary of a first electromechanical switch 32a and a second channel ch2 connected to the drain electrode D of the transistor 30 by the intermediary of a second electromechanical switch 32b. The generator 31 can thus apply on the electrodes G and D the pulses required to write and erase the memory cell (maximum amplitude equal to 20 V and duration between 1 μs and 200 ms, cf. FIG. 1).

In other terms, the voltage generator 31 controls the writing and erasing operations of the memory cell. However, the generator 31 does not allow to read the memory cell, as it is incapable of measuring the drain current $I_D$ according to the voltage $V_G$ applied on the gate.

The read operations are therefore performed by means of two Source Measure Units (SMU) 33a and 33b. The output of the SMU 33a is connected to the gate electrode G by the intermediary of the switch 32a, while the output of the SMU 33b is connected to the drain electrode D by the intermediary of the switch 32b. The SMU are instruments that allow to apply a voltage (respectively a current) and to simultaneously measure the corresponding current (respectively the voltage). Here, they are used to simultaneously apply a voltage ramp $V_G$ on the gate ($V_G=0\rightarrow10$ V) and a low voltage $V_D$ on the drain ($V_D=0.5$ V), and in order to measure in return the drain current $I_D$. The characteristic $I_D(V_G)$ is therefore obtained which makes it possible to extract the threshold voltage $V_T$.

Switches 32a and 32b allow, by switching from one position to the other, to couple the electrodes G and D of the transistor 30, either to the generator 31 for the writing and erasing operations, or to the SMU 33a and 33b for the reading operations.

The SMU 33a and 33b are static (or DC) characterisation devices, as they measure the signals during long periods of time, of at least several milliseconds. For example, measuring the drain current $I_D$ during the voltage ramp $V_G$ can take up to several seconds with such devices. However a static characterisation does not allow for a realistic measurement of the properties of the memory cell. Indeed, the traps created by the ageing of the gate oxide can during the measurement capture and emit charge carriers that modify the electrostatic properties of the cell, resulting in a distortion of the measurement. Inversely, a dynamic characterisation, i.e. in a short lapse of time (typically less than a millisecond), will not leave the time for the traps to capture or release charge carriers and will reflect the intrinsic properties of the memory cell. Dynamic measuring instruments are therefore required in order to more accurately characterise the electrical behaviour of a memory cell.

The apparatuses called PIV ("Pulsed I-V system") or FMU ("Fast Measurement Unit") have been sold for this purpose. Mention can be made by way of example of the model "Agilent B1530". It can generate pulses and voltage ramps while dynamically measuring currents between 1 pA and 10 mA, typically with a sampling duration of about 10 ns. This tool is primarily for electronic devices operating under moderate bias, as the amplitude of the signals delivered is limited to 10 V.

The document ["Impact of endurance degradation on the programming efficiency and the energy consumption of NOR flash memories", V. Della Marca and al., Microelectronics Reliability, Volume 54, pp. 2262-2265, 2014] proposes a system for the characterisation of NOR-type flash memory cell that makes possible both an endurance test (i.e. a sequence of write and erase cycles), a static measurement of the read current $I_D(V_G)$ and a dynamic measurement of the write current $I_D(t)$ (where t is the write time). This characterisation system is diagrammed in FIG. 4, which uses the nomenclature of FIG. 3.

The characterisation system of the aforementioned document correspond to the characterisation system of FIG. 3, to which two other SMU 33c-33d, a dynamic measurement apparatus (PTV) 34 (Agilent B1530) and three other electromechanical switches with two positions 32c, 32d and 32e have been added. The PTV apparatus 34 comprises three channels ch1, ch2 and ch3 connected respectively to the gate G, drain D, and source S electrodes of the floating gate transistor 30. These connections are carried out by means of switches 32c to 32e, because the electrodes G, D and S also have to be connected to the generator 31 and/or to the SMU 33a to 33c (by the intermediary of switches 32a-32b with regards to the SMU 33a-33b and the generator 31). The outputs of the SMU 33c and 33d are connected respectively to the source electrode S (by the intermediary of the switch 32e) and to the bulk B of the floating gate transistor 30.

Thus, the characterisation system of FIG. 4 comprises three types of instruments connected to the electrodes of the floating gate transistor 30 by the intermediary of two groups of switches. These two groups are comprised of the switches 32a and 32b on the one hand, and of switches 32c to 32e on the other hand. As hereinabove, the generator 31 is in charge of the write and erase operations, while the SMU 33a and 33b proceed with reading the memory cell (measurement $I_D(V_G)$ in order to extract the threshold voltage). The two additional SMU 33c and 33d are used to bias the electrodes S and B, in order to allow for other write (application of a bias $V_B$ on the bulk) or read (measurement of the source current $I_S$ according to $V_G$) mechanisms. Finally, the PIV apparatus 34 makes it possible to dynamically measure the drain current $I_D$ during a write (in the case where the write operation is performed by the PIV apparatus 34), in order in particular to deduce from it the electrical power consumption of the memory cell. This is then referred to as a "dynamic" write.

Switches 32a to 32e allow to interrupt the write and erase cycles controlled by the generator 31, so that the SMU 33a to 33d can read the memory cell or so that the PIV apparatus 34 can perform a write operation with a dynamic measurement of the drain current $I_D$. They are constituted of electromechanical relays, in order to overcome any parasitic current during the measurement of the drain current $I_D$. On the other hand, this type of switches have long switching times, of around several milliseconds.

FIGS. 5A and 5B show a way of introducing the dynamic read or write operations into an endurance test, thanks to the characterisation system of FIG. 4. The cycles noted C are conventional write and erase cycles, performed by means of the generator 31. Between two of these cycles C, a specific write and erase cycle C' (FIG. 5A) or C" (FIG. 5B) is carried out. The cycle C' comprises a first read after erasing the memory cell and a second read after writing to the memory cell. Two values of the threshold voltage are thus obtained, one in the erased state and the other in the written state. In the cycle C", the conventional write operation is replaced with a dynamic write operation, in order to have an accurate measurement of the drain current $I_D$ and to deduce from it the energy consumed by the write operation. The blocs "DL" located before and after each read in the cycle C' (FIG. 5A) or before and after each dynamic write in the cycle C" (FIG. 5B) represent the time required to switch the electromechanical switches 32a-32b (FIG. 5A) or the switches 32c to 32e (FIG. 5B) from one position to the other.

The switching times DL of the electromechanical switches 32a to 32e are not controlled and can distort the electrical characterisation. Indeed, during these time intervals of several milliseconds, the memory cell undergoes an electrostatic relaxation. This results in that the threshold voltage measured during the read is not representative of the written or erased state of the memory cell, but of a relaxed state. An accurate analysis of the reliability of the memory cell is then impossible. Likewise, the measurement of the electrical power consumption coming from the dynamic write of FIG. 5B does not form reliable information on the ageing of the memory cell, also due to the electrostatic relaxation of the memory cell during the switching times DL.

The switching of the electromechanical switches 32a to 32e can furthermore cause voltage peaks that can modify the bias of the cell and therefore its electrical behaviour. These voltage peaks are consequently detrimental to the analysis of reliability.

Finally, since the read operations are performed by the SMU, i.e. statically, the characterisation system of FIG. 4 has the same defect as the characterisation system of FIG. 3, namely a potential distortion of the measurement during the read.

SUMMARY

There is a need to provide a characterisation system of the endurance of a NOR-type flash memory cell, which prevents the relaxation of the memory cell and which does not produce voltage peaks, so that this characterisation is as accurate as possible.

According to an aspect of the invention, this need is satisfied by providing in this characterisation system:
- a voltage generator that has an output connected to the gate electrode and configured to generate as output an erase signal of the memory cell;
- a dynamic measurement apparatus comprising a first channel connected to the gate electrode and a second channel connected to the drain electrode, the dynamic measurement apparatus being configured to generate on the first and second channels write signals of the memory cell and to measure a current flowing in the drain electrode during the writing of the memory cell;

where only the gate electrode of the floating gate transistor is connected to the voltage generator and to the dynamic measurement apparatus by the intermediary of a switch, the switch being of the CMOS type and able to switch between a first position, wherein the output of the voltage generator is electrically coupled to the gate electrode, and a second position, wherein the first channel of the dynamic measurement apparatus is electrically coupled to the gate electrode, and where the dynamic measurement apparatus is furthermore configured to generate a synchronisation signal transmitted to the voltage generator and to the switch in order to simultaneously control the generation of the erase signal and the switching of the switch into the first position.

The fact that only the connection to the gate electrode of the floating gate transistor is provided with a switch (this switch being of the CMOS type) implies that the drain electrode of the transistor is not connected to the dynamic measurement apparatus through the means of any switch.

A switch of the CMOS type can, contrary to a switch of the electromechanical type, switch from one position to the other in a very short lapse of time, less than 1 µs. Combined with the fact that the switching of the switch is synchronised with the erase signal of the voltage generator, this makes it possible to chain with practically no interruption the write and erase and possibly read operations. The relaxation of the memory cell does not in this case have the occasion to occur.

A disadvantage of the CMOS switch is that it generates a leakage current in the branches that it connects. This parasitic current is detrimental for the current measurements of the transistor, that is why the electromechanical switches of characterisation systems of prior art were not replaced with CMOS switches. In particular, a CMOS switch upstream of the drain electrode would distort the measurement of the drain current, and therefore the determination of the threshold voltage and of the electrical power consumption.

Here, the only switch used is arranged upstream of the gate electrode, for which no current is expected due to strong impedance of the gate electrode. Furthermore, a switch of the CMOS type does not cause, when it is switched, any voltage jump. It is therefore perfectly suited to be coupled with the gate electrode of the transistor.

In an embodiment of the characterisation system, the dynamic measurement apparatus is furthermore configured to generate on the first and second channels read signals of the memory cell and to measure the current flowing in the drain electrode during the read of the memory cell. A distortion of the measurement caused by the use of SMU ("Source Measure Unit") is thus avoided. Since the dynamic measurement apparatus controls both the write operations and the read operations, an endurance test with dynamic measurement of the current can be performed with only two instruments. The characterisation system of an embodiment of the invention is therefore simpler and more economical than the characterisation system of prior art that proposes the same functions.

In an embodiment, the second channel of the dynamic measurement apparatus is connected directly to the drain electrode of the floating gate transistor.

The dynamic measurement apparatus comprises, in an embodiment, third and fourth channels connected respectively to a substrate of the floating gate transistor and to a source electrode of the floating gate transistor, the dynamic measurement apparatus being furthermore configured to measure the currents of the substrate and of the source electrode during the write operations.

BRIEF DESCRIPTION OF THE FIGURES

Other characteristics and benefits of the invention shall appear clearly in the description which is given of them hereinbelow, for the purposes of information and in no way limiting, in reference to the annexed figures, among which.

For increased clarity, identical or similar elements are marked by identical reference signs over all of the figures.

DETAILED DESCRIPTION

Figure 6:
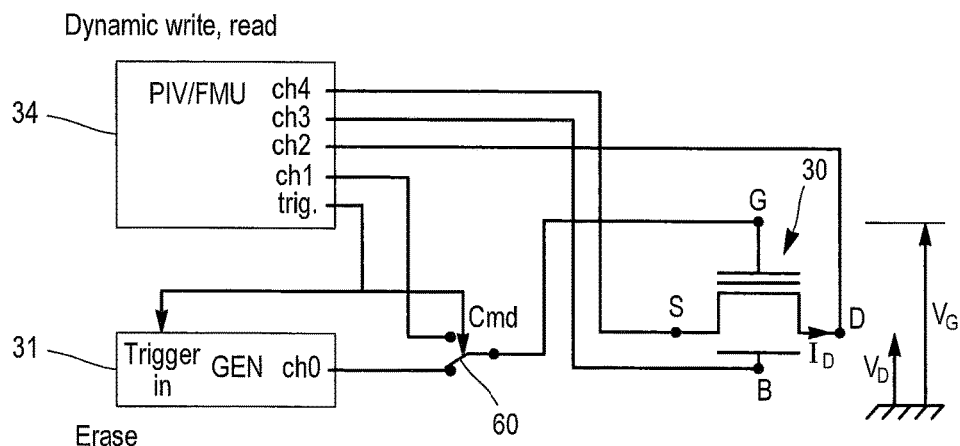
FIG. 6 schematically shows a characterisation system of a NOR flash memory cell, according to an embodiment of the invention.

FIG. 6 shows an embodiment of a characterisation system allowing to accurately measure the endurance of an "EEPROM-Flash" memory cell (commonly called a flash memory), of the NOR type. The cell comprises a NMOS floating gate transistor 30 provided with four electrodes: the control gate G, the drain D, the source S and the bulk B (the floating gate and the conduction channel do not form control electrodes of the transistor 30). The storage of the information is based on the trapping of electrical charges in the floating gate, which causes a variation in the threshold voltage of the transistor between the written state (or programed state) and the erased state of the memory cell.

This characterisation system comprises a dynamic measurement apparatus 34, commonly referred to as PIV ("Pulsed I(V) system") or FMU ("Fast Measurement Unit"), making it possible to generate voltages between −10 V and 10 V and to simultaneously measure currents. Mention can be made by way of example of the model FMU "B1530" sold by "Agilent Technology" or the model PIV "4225-RPM" sold by "Keithley Instruments".

The dynamic measurement apparatus 34 is provided with two main channels ch1-ch2 and a secondary channel "trig". The channel ch1 is connected to the gate electrode G of the floating gate transistor 30, by the intermediary of a switch 60 of the CMOS type, while the channel ch2 is connected to the drain electrode D of the transistor 30.

The apparatus 34 is configured to generate on the channels ch1-ch2 signals allowing to write to the NOR-type memory cell, and more exactly:
  on the channel ch1 (i.e. to bias the gate electrode G), a voltage pulse with amplitude between 6 V and 10 V during a duration between 1 μs and 10 μs; and
  on the channel ch2 (i.e. to bias the drain electrode D), a voltage pulse with amplitude between 3 V and 5 V for a duration between 1 μs and 10 μs.

In other terms, the apparatus 34 is programed to control the write operations of the memory cell, by suitably biasing the electrodes G and D of the transistor 30.

The apparatus 34 is furthermore capable of dynamically measuring the current $I_D$ flowing in the drain electrode D (and in the channel ch2), called drain current hereinafter, during a write operation. A dynamic measurement of the current is taken at a sampling frequency that is much higher that a so-called static measurement (or DC). In an embodiment, the period of time that separates two samplings of the drain current $I_D$ is between 1 ns and 100 ns, for example 10 ns. For the purposes of comparison, the sampling period in a static measurement is about several tens of milliseconds. The apparatus 34 thus allows for a reliable measurement of the write current, from which stems in particular the calculation of the electrical power consumption. Indeed, using the measurement of the drain current $I_D$ and knowing the voltage $V_D$ applied on the drain by means of the channel ch2, it is possible to calculate the energy $E_C$ consumed by the memory cell when it is written to, thanks to the following relationship:

$$E_C = \int_{t=0}^{t=tp} V_D(t) \cdot I_D(t) \cdot dt \quad (1)$$

where "tp" is the write time, i.e. the shortest duration between the pulses on the electrodes G and D (between 1 μs and 10 μs).

In an embodiment, the drain electrode D is connected directly to the dynamic measurement apparatus 34, i.e. no device is arranged between the electrode D and the channel ch2. Thus, nothing can disturb the dynamic measurement of the drain current taken by the apparatus 34.

The characterisation system of FIG. 6 further comprises a voltage generator 31, whose the only output used "ch0" is connected to the gate electrode G of the transistor 30 by the intermediary of the CMOS switch 60. This generator 31 is capable of providing as output ch0 voltages between −20V and +20 V. Furthermore, it operation can be controlled by an external signal. To this effect, it has a control input, generally designated as "trigger in" the off-the-shelf apparatuses. The pulse and sequence generator "Agilent 81110A" sold by "Agilent Technology" is an example of a voltage generator that can be used in the characterisation system.

The voltage generator 31 is configured to deliver on the output ch0 an erase signal of the memory cell, which is a voltage pulse with amplitude between 10 V and 20 V for a duration between 1 ms and 200 ms. This pulse is applied on the gate electrode G of the transistor 30, when the CMOS switch 60 is in the suitable configuration.

The CMOS switch 60 can indeed switch between a first position, in which the output ch0 of the generator 31 is electrically coupled to the gate electrode G, and a second position, wherein the channel ch1 of the apparatus 34 is electrically coupled to the electrode G. The switch 60 therefore makes it possible to pass from an erase operation to a write operation, and vice versa. It comprises one or several MOSFET transistors capable of withstanding voltages of at least 20 V in amplitude. Its switching time is, in an embodiment, less than 100 ns. By way of example, the switch 60 of FIG. 6 is an analogue CMOS switch sold by "Maxim" under reference "MAX333A".

In addition to being fast, the switching of the switch 60 between the first and second positions is carried out in synchronisation with the operation of the voltage generator 31, thanks to a synchronisation signal coming from the channel "trig" of the apparatus 34. This synchronisation signal is directed as input "trigger in" of the generator 31 on the one hand, and on a control input "Cmd" of the CMOS switch 60 on the other hand. It controls the turning on and the standby mode of the generator 31, at the same time as the switching of the switch 60 between the first and second positions.

Figure 7A:
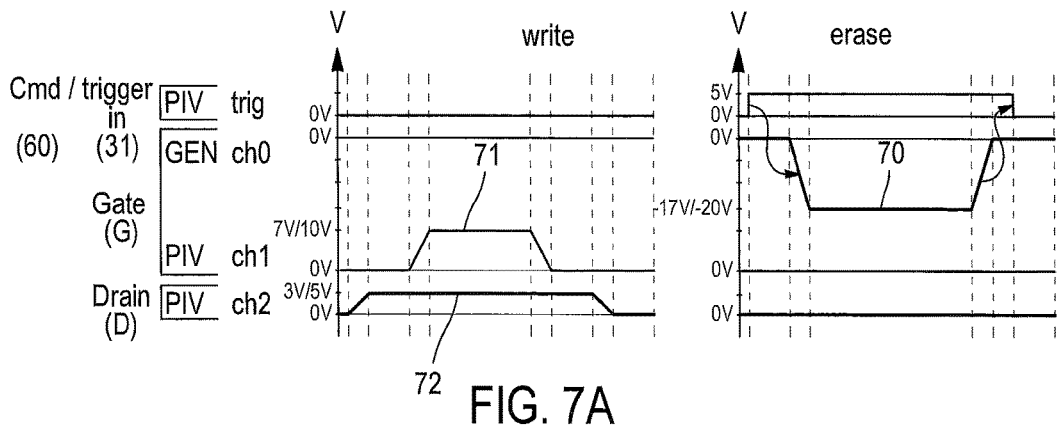
FIGS. 7A and 7B are chronograms of the signals used in the characterisation system of FIG. 6, in order to perform the write, erase and read operations of the memory cell.

FIG. 7A groups together chronograms corresponding to the signals on the channels ch1-ch2 of the dynamic measurement apparatus (PIV), of the signal at output ch0 of the voltage generator (GEN) and of the synchronisation signal on the secondary channel "trig" of the dynamic measurement apparatus. On the left are shown the chronograms during a write operation and on the right are shown the chronograms during an erase operation of the memory cell of the NOR type. For reasons of clarity, the signals are designated hereinafter by using the references of the channels/outputs from which they come.

The signals ch0 and ch1 are addressed alternating to the gate electrode G, while the signal ch2 is sent to the drain electrode D. The "trig" signal is sent simultaneously to the control input "Cmd" of the switch 60 and to the input "trigger in" of the generator 31.

The synchronisation signal "trig" becomes active (for example V=5V) when it is desired to erase the memory cell, for example immediately after a write operation during an endurance measurement. The active state of the synchronisation signal "trig" triggers the establishment of an erase pulse 70 as output ch0 of the generator 31. The floating gate transistor 30 being of the NMOS type, the voltage pulse 70 is negative, typically between −10 V and −20 V. Simultaneously, the CMOS switch 60 is switched to the first position. The output ch0 is then electrically connected to the electrode G in order to apply thereon the pulse 70, while the channel ch1 is decoupled from this same electrode G. Then, the signal ch1 can be of any, for example a zero voltage such as is shown in FIG. 7A. The signal ch2, coming from the dynamic measurement apparatus PIV and applied on the drain electrode D, is a zero voltage during the erase operation. The erase pulse 70 ends shortly before the "trig" signal passes from the active state to the inactive state (for example 0 V). When the "trig" signal becomes inactive, the generator 31 is placed on standby until the next activation of the "trig" signal, i.e. until the next erase operation, and the switch 60 is switched to the second position, where the channel ch1 is coupled to the electrode G (as a replacement for the channel ch0).

The dynamic measurement apparatus PIV then takes the relay for the voltage generator GEN and alone controls the write operation of the memory cell. During this write, the signals "trig" and ch0 are inactive. On the other hand, a pulse 71 of short duration and of high amplitude (between 7-10 V) is generated by the measurement device PIV on its channel ch1, intended for the gate electrode G. Furthermore, a pulse 72 of lower amplitude (3-5 V) comes from its channel ch2 and transmitted to the drain electrode D. The pulses 71 and 72 are positive, as the transistor 30 is of the NMOS type. In an embodiment, the pulse of the drain 72 starts before and finishes after the gate pulse 71, so that the bias of the drain D is well established when the pulse 71 is applied on the gate G. Consequently, it has a longer duration than the gate pulse 71. By way of example, the pulse 72 lasts about 2 μs, while the pulse 71 only last about 1 μs.

In an embodiment, the channel "trigger" of the apparatus PIV is synchronised to the nearest 5 ns with the first of the channels ch1-ch2, i.e. the channel ch2 in the embodiment implemented of FIG. 7A. In other terms, the time between the deactivating of the signal "trigger" and the activating of the signal ch2 (erase=>write), or the deactivating of the write signal ch2 and the activating of the "trigger" signal (write=>erase), is at most 5 ns.

Thus, contrary to the characterisation systems of prior art, the control signal of the switch, allowing for the transition between writing and erasing, is not the result of a computer command. It is here generated by the dynamic measurement apparatus and transmitted directly to the voltage generator, which guarantees an excellent synchronisation between these two pieces of equipment.

In addition to the "dynamic" write, which corresponds to a conventional write operation combined with a dynamic measurement of the write current, the dynamic measurement apparatus 34 of FIG. 6 can control a read operation of the memory cell. This read is accomplished without making use of the voltage generator 31. The CMOS switch 60 is therefore placed in its second position, so that the channel ch1 of the apparatus 34 is coupled to the gate electrode C.

Figure 7B:
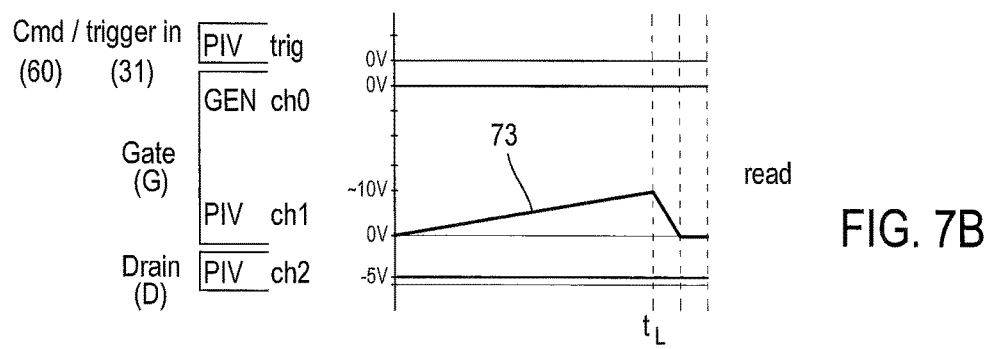

FIG. 7B groups together, in the same way as FIG. 7A, the chronograms of the signals "trig", ch0 to ch2 during the read of the memory cell. The signals "trig" and ch0 are inactive (0 V). The signal ch1 applied on the gate electrode G is a voltage ramp 73, starting from 0 V and reaching about 10 V at the end of a read time $t_L$ between 10 μs and 100 is. During the voltage ramp 73, the signal ch2 biases the drain D at a voltage of about 0.5 V.

The apparatus 34, in an embodiment, measures the drain current $I_D$ during the read of the memory cell. This allows to extract the threshold voltage of the floating gate transistor 30, by tracing the current-voltage characteristic $I_D(V_G)$, $V_G$ being the voltage applied on the gate G, and therefore to determine the state of the memory cell. As the read operation is controlled by the apparatus 34 only, it can be carried out in a very short lapse of time (10-100 μs). Any distortion in the measurement of the read current is thus overcome.

Figure 8:
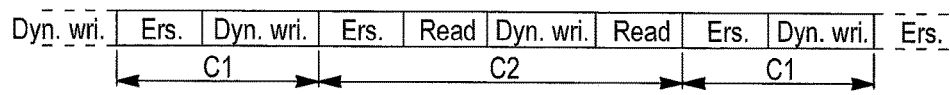
FIG. 8 shows an optimum endurance measurement that can be implemented thanks to the characterisation system of FIG. 6.

FIG. 8 shows an embodiment for measuring the endurance by the characterisation system of FIG. 6. This endurance measurement is comprised of erase-dynamic write cycles C1, and of erase-dynamic write cycles C2 in which read operations have been introduced. Each cycle C1 allows to establish a current characteristic $I_D(t)$ of the floating gate transistor and therefore to calculate the energy consumed by the memory cell during the write operation of the cycle. A monitoring of the electrical consumption as cycles C1 unfold, i.e. during the ageing of the memory cell, can therefore be carried out thanks to the characterisation system. Each cycle C2 allows for the establishment of a current-voltage characteristic $I_D(V_G)$ and the determination of the voltage thresholds $V_T$ in the erased state (read after erase) and in the written state (read after write).

Contrary to the characterisation systems of prior art, the various operations in the measuring of endurance can be chained together without any waiting time. This is made possible thanks to the fact that a CMOS switch synchronised with the operation of the voltage generator is used, in order to switch between "erase" and "dynamic write" or between "erase" and "read", and thanks to the fact that the read is performed with the same equipment as the dynamic write (with regards to the read ⇔ dynamic write transition). Thus, it is now possible to prevent the relaxation of the memory cell between two successive operations of the endurance measurement, regardless of what these operations are. The endurance measurement hence reflects the ageing of the memory cell with more fidelity.

Figure 5A:
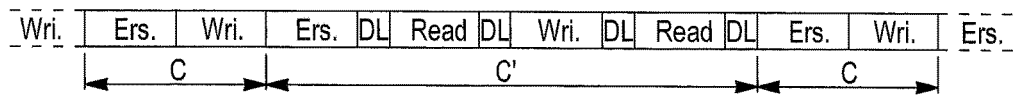
FIGS. 5A and 5B, described hereinabove, show two endurance sequences implemented by the characterisation system of FIG. 4.
Figure 5B:
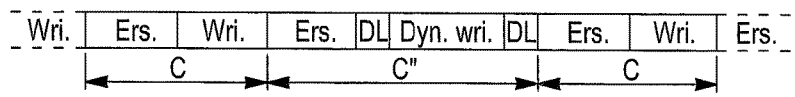

The characterisation system of FIG. 6 offers the possibility of studying the impact of a relaxation of the memory cell between the write and erase operations on the reliability of the memory cell. Indeed, a period of time in which the duration is controlled—contrary to the period of time DL of FIGS. 5A and 5B—can be introduced voluntarily between these two operations, by adapting the synchronisation signal of the dynamic measurement apparatus 34.

During the dynamic write, erase and read operations hereinabove, the source electrode S and the bulk B of the floating gate transistor 30 can both be connected to the ground. Indeed, the voltage needed on each of these electrodes is zero.

However, in the embodiment of FIG. 6, the dynamic measurement apparatus 34 is provided with two other main channels ch3 and ch4, connected respectively to the source electrode S and to the bulk B of the transistor 30. The channels ch3 and ch4 allows to bias at a zero voltage the electrodes S and B and, simultaneously, to dynamically measure the currents of the source S and of the bulk B. Measurement of the source and/or bulk current is of great use in studying the mechanisms of ionisation by impact in the channel of the transistor. Indeed, this ionisation generates electron-hole pairs which are dissociated under the effect of the electric field in the channel, with the holes being recovered by the bulk B. Like the drain electrode D, the electrodes S and B are, in an embodiment, connected directly to the measurement device 34, so that the current measurements are not disturbed by any device.

Figure 1:
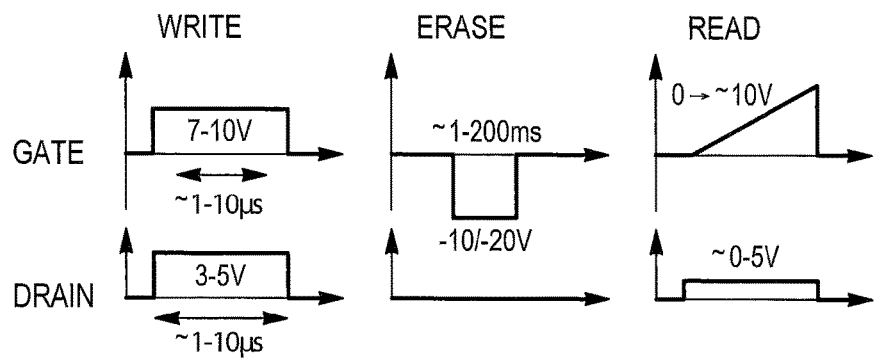
FIG. 1, described hereinabove, shows the signals applied to the gate and drain electrodes of a floating gate transistor, in order to write, erase and read a NOR flash memory cell.
Figure 2:
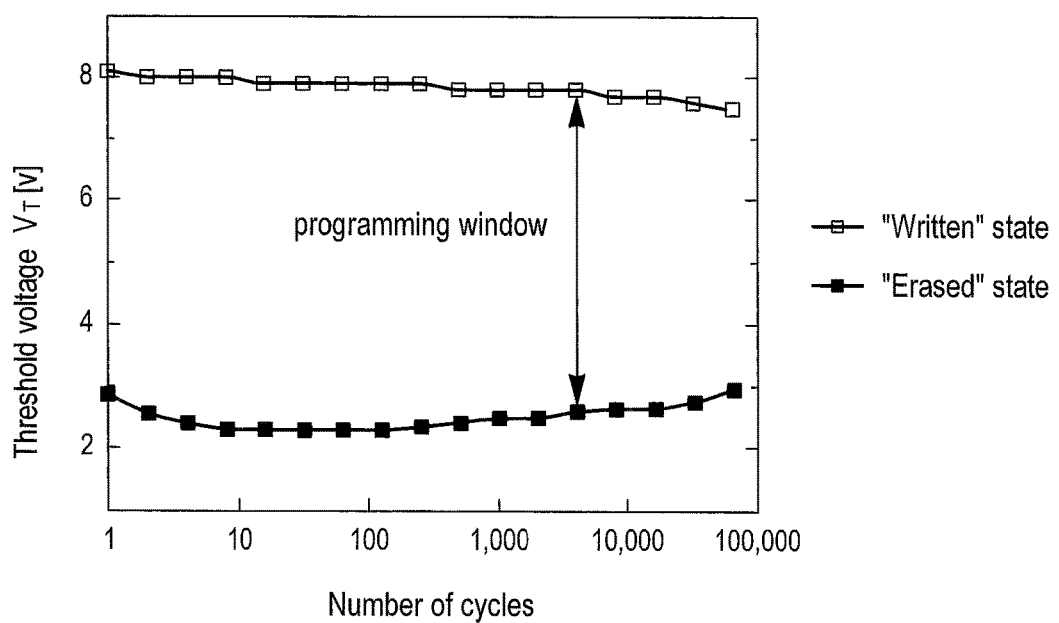
FIG. 2, described hereinabove, is a graph of the endurance measurement of a flash memory cell, showing the change in the threshold voltage of the floating gate transistor in the written state and in the erased state.
Figure 3:
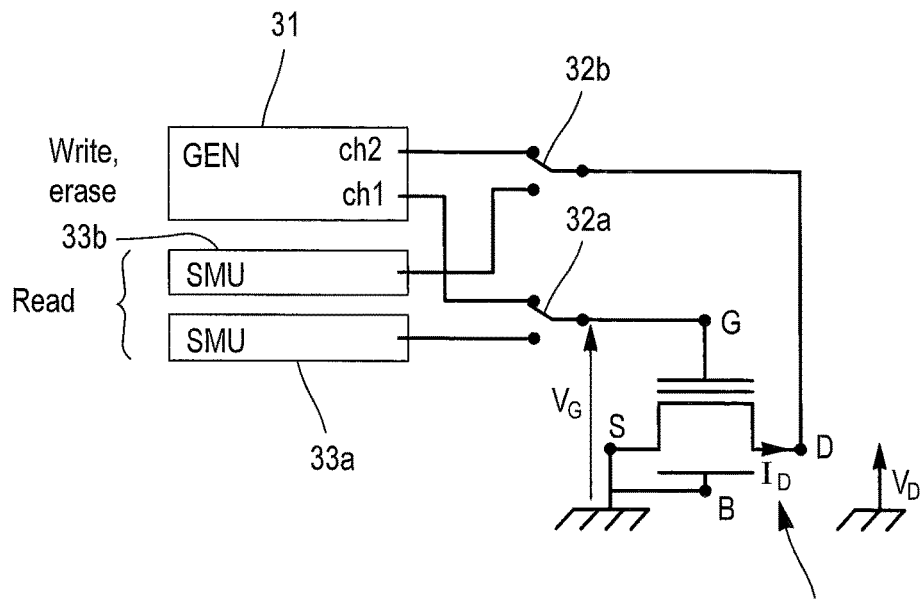
FIG. 3, described hereinabove, shows a first characterisation system of a flash memory cell according to prior art.
Figure 4:
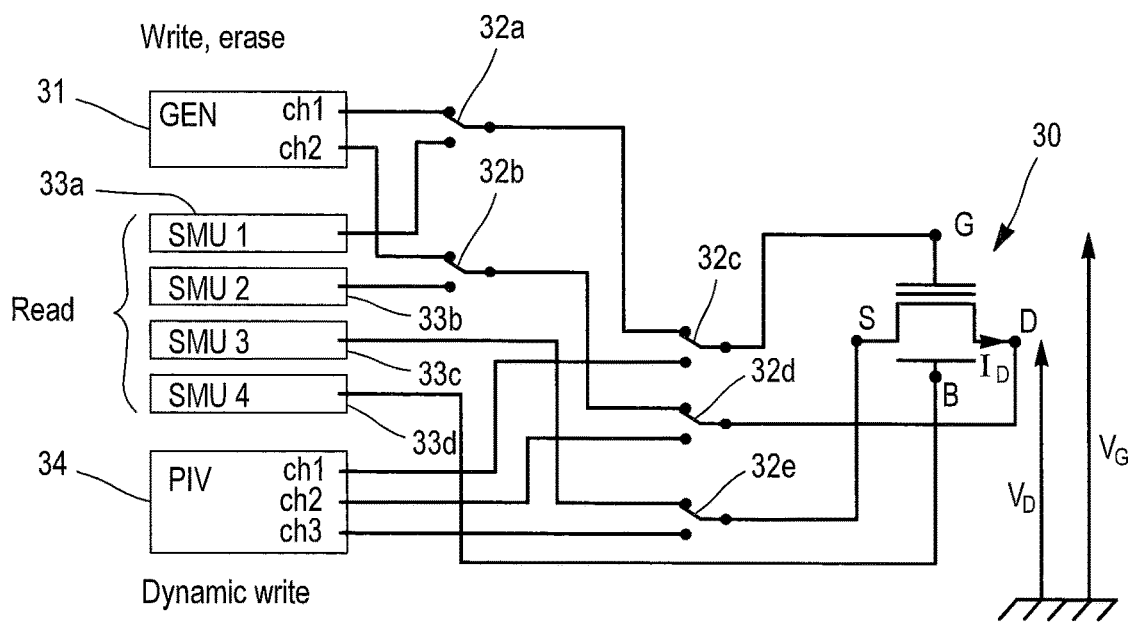
FIG. 4, described hereinabove, shows a second characterisation system of a flash memory cell according to prior art.

Like the characterisation system shown in FIG. 4, the connections on the bulk and the source make it possible to study other write (ex. application of a non-zero bias on the bulk B during a conventional write) or read (ex. measurement of the source current according to the gate voltage $V_G$) mechanisms.

Although it is schematically shown by a single element in FIG. 6, it is easily understood that the apparatus 34 can be comprised of two modules that each have two main channels, with these modules being interconnected in order to operate simultaneously.

Figure 9:
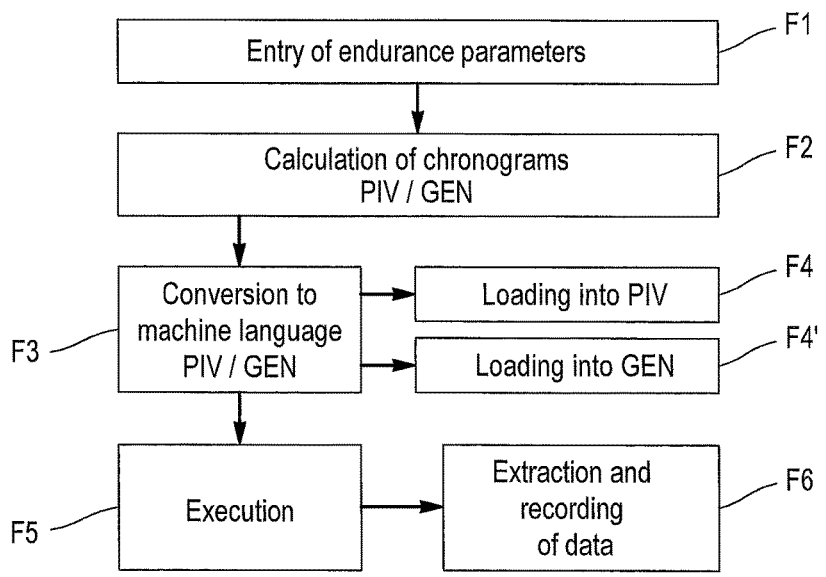
FIG. 9 is a flowchart of a software that allows to control the characterisation system of FIG. 6.

FIG. 9 is a flowchart, or execution diagram, of a program implemented by computer in order to control the characterisation system of FIG. 6. In an embodiment, the computer includes a physical memory and a physical processor. The physical memory includes hardware circuit components to perform its functions. The memory is encoded with code instructions for implementing or causing to implement, via the processor, the different steps of the flowchart explained below.

This program displays on the computer a user interface that requires, during a step F1, the entry of parameters by the user. The parameters to be entered can concern conditions for writing, erasing and reading (such as the duration of the operations and the corresponding voltage level), measurement calibres (for example 1 μA, 100 μA, 10 mA) and/or endurance parameters (number of write/erase cycles, number and position of the read operations, any delays between the write and erase operations, etc.).

Once the parameters are entered, the computer calculates during a step F2 the chronograms of the signals of the dynamic measurement apparatus PIV and of the voltage generator GEN, at least the chronograms of the signals ch0, ch1, ch2 and "trig" (cf. FIG. 7A-7B).

These chronograms are then converted into instructions that can be executed by the dynamic measurement apparatus and by the voltage generator, during a step F3. These instructions define the configuration of the two pieces of equipment needed to correctly perform the endurance measurement desired by the user.

Then, in F4 and F4', this configuration is loaded into each piece of equipment, the dynamic measurement apparatus PIV and the voltage generator GEN respectively.

During a step F5, the computer triggers the execution of instructions stored in the apparatus PIV. This has for effect to initiate the endurance measurement. The voltage generator GEN is not controlled by the computer during the measurement of endurance, but by the apparatus PIV thanks to the synchronisation signal. Once the sequence of cycles is initiated, the endurance measurement is conducted by the apparatus PTV only and the characterisation system is autonomous.

As soon as the endurance measurement is completed, data is extracted from the apparatus PIV by the computer and displayed for the user, during a step F6. In an embodiment, this data includes:

a set of current characteristics $I_D(t)$, each characteristic $I_D(t)$ corresponding to the plot of the drain current during a write operation, after a variable number of write/erase cycles;

and beneficially, a set of characteristics $I_D(V_G)$, with each characteristic $I_D(V_G)$ corresponding to a read operation during which the drain current $I_D$ is measured according to the voltage $V_G$.

Figure 10A:
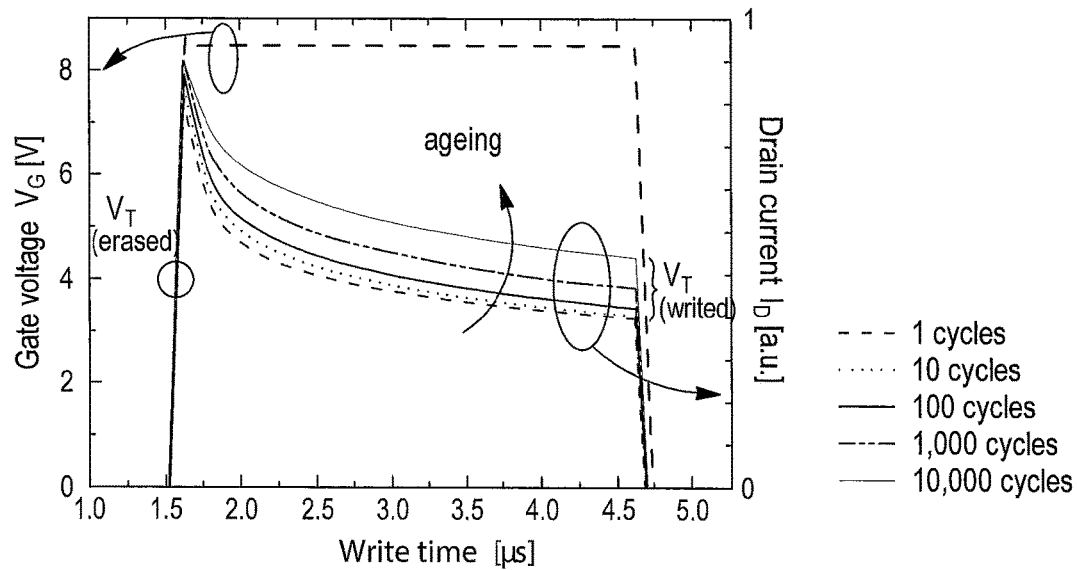
FIGS. 10A and 10B are examples of curves obtained thanks to the characterisation system of FIG. 6.

FIG. 10A is a graph that shows a plurality of current characteristics $I_D(t)$. Five characteristics are shown, after respectively 1, 10, 100, 1,000 and 10,000 write and erase cycles. The drain current $I_D$ (represented on the y-axis on the right) is expressed as a relative value, from 0 to 1 (without a unit). The write time (on the x-axis) is the same for all of the cycles. Moreover, the voltage $V_G$ applied on the gate during write operations (y-axis scale on the left) was superposed on these characteristics $I_D(t)$. The voltage pulse $V_G$ has a duration of about 3 μs.

It is observed on this graph the increase in the drain current $I_D$ as the number of write and erase cycles increases, which is representative of the ageing of the memory cell.

Figure 10B:
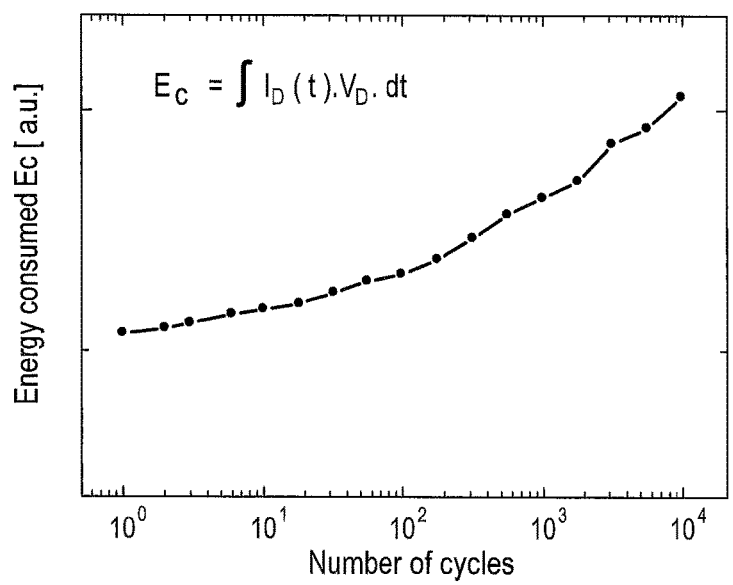

Each characteristic $I_D(t)$ allows to determine the energy $E_C$ consumed by the cell during a write operation, by calculating (cf. relation (1) hereinabove) the integral of the current $I_D(t)$ multiplied by the voltage $V_D$ (with the latter being constant during the write operation). The change in the electrical power consumption of the memory cell can thus be monitored all throughout its ageing. The graph of FIG. 10B is an example of a plot showing that this energy consumed $E_C$ increases as the write and erase cycles occur.

The characteristics $I_D(t)$ further allows to monitor the changes in the threshold voltage $V_T(t)$ during the write operation, from the erased state at t≈1.5 ps to the written state at t≈4.5 μs. The threshold voltage values of the transistor in the erased state and in the written state can be calculated using values of the drain current (respectively at t≈4.5 μs and t≈4.5 μs).

It is therefore not required to read the characteristic $I_D(V_G)$, and therefore to proceed with reads of the memory cell, in order to follow the change in the voltage thresholds of the floating gate transistor. The endurance measurement could consequently be comprised solely of dynamic write and erase cycles C1.

It nevertheless remains beneficial to perform read operations of the memory cell as they provide the user with parameters other than the threshold voltage, in particular the mobility of the charge carriers and the concentrations in traps in the gate oxide and at the interface between the gate oxide and the bulk. Indeed, these various parameters can be extracted from the characteristics $I_D(V_G)$.

The invention claimed is:

1. A system for characterising a NOR-type flash memory cell provided with a floating gate transistor, the floating gate transistor comprising a gate electrode and a drain electrode, the characterisation system comprising:
a voltage generator including an output connected to the gate electrode and configured to generate as output an erase signal of the memory cell ; and
a dynamic measurement apparatus comprising a first channel connected to the gate electrode and a second channel connected to the drain electrode, the dynamic measurement apparatus being configured to generate on the first and second channels write signals of the memory cell and to measure a current flowing in the drain electrode during the writing of the memory cell;
wherein only the gate electrode of the floating gate transistor is connected to the voltage generator and to the dynamic measurement apparatus by the intermediary of a switch, the switch being of the CMOS type and able to switch between a first position, in which the output of the voltage generator is electrically coupled to the gate electrode, and a second position, in which the first channel of the dynamic measurement apparatus is electrically coupled to the gate electrode, and
wherein the dynamic measurement apparatus is configured to generate a synchronisation signal transmitted to the voltage generator and to the switch in order to simultaneously control the generation of the erase signal and the switching of the switch to the first position.

2. The system according to claim 1, wherein the dynamic measurement apparatus is configured to generate on the first and second channels read signals of the memory cell and to measure the current flowing in the drain electrode during the read of the memory cell.

3. The system according to claim 1, wherein the second channel of the dynamic measurement apparatus is connected directly to the drain electrode of the floating gate transistor.

4. The system according to claim 1, wherein the dynamic measurement apparatus further comprises third and fourth channels connected respectively to a substrate of the floating gate transistor and to a source electrode of the floating gate transistor, the dynamic measurement apparatus being configured to measure currents in the substrate and in the source electrode.

* * * * *

UNITED STATES PATENT AND TRADEMARK OFFICE
CERTIFICATE OF CORRECTION

PATENT NO. : 10,067,185 B2
APPLICATION NO. : 14/996520
DATED : September 4, 2018
INVENTOR(S) : Jean Coignus et al.

Page 1 of 1

It is certified that error appears in the above-identified patent and that said Letters Patent is hereby corrected as shown below:

On the Title Page

Item (73) Assignee:
Please correct the Assignee name as follows:
COMMISSARIAT À L'ÉNERGIE ATOMIQUE ET AUX ÉNERGIES ALTERNATIVES, Paris (FR)

Signed and Sealed this
Twenty-third Day of October, 2018

Andrei Iancu
*Director of the United States Patent and Trademark Office*